(12) United States Patent
Saito et al.

(10) Patent No.: US 7,898,315 B2
(45) Date of Patent: Mar. 1, 2011

(54) ANALOG MULTIPLEXER WITH INSULATION POWER SUPPLY

(75) Inventors: Seiichi Saito, Tokyo (JP); Yoshihiro Akeboshi, Tokyo (JP); Hirokazu Nomoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 29 days.

(21) Appl. No.: 12/525,556

(22) PCT Filed: Apr. 14, 2008

(86) PCT No.: PCT/JP2008/057271

§ 371 (c)(1), (2), (4) Date: Aug. 3, 2009

(87) PCT Pub. No.: WO2008/133081

PCT Pub. Date: Nov. 6, 2008

(65) Prior Publication Data

US 2010/0019828 A1    Jan. 28, 2010

(30) Foreign Application Priority Data

Apr. 19, 2007 (JP) ............................... 2007-110272

(51) Int. Cl.
*H03K 17/00* (2006.01)

(52) U.S. Cl. ....................................... 327/407; 327/408

(58) Field of Classification Search .................. 327/99, 327/407, 408

See application file for complete search history.

(56) References Cited

U.S. PATENT DOCUMENTS 7,098,719 B2 *   8/2006   Oppelt ...................... 327/407

FOREIGN PATENT DOCUMENTS

| JP | 51 85769   | 7/1976  |
| JP | 58 24232   | 2/1983  |
| JP | 58 99013   | 6/1983  |
| JP | 60 75999   | 4/1985  |
| JP | 62 144233  | 6/1987  |
| JP | 62 242412  | 10/1987 |
| JP | 63 113622  | 5/1988  |

* cited by examiner

*Primary Examiner* — Hai L Nguyen
(74) *Attorney, Agent, or Firm* — Oblon, Spivak, McClelland, Maier & Neustadt, L.L.P.

(57) ABSTRACT

An analog multiplexer with an insulated power supply includes: an analog signal transformer receiving an analog signal input in its primary winding via an FET, and ON/OFF driving the FET to generate a pulse with an amplitude of the analog signal in its secondary winding; a drive transformer receiving a drive pulse input in its primary winding via an FET to generate a pulse turning ON/OFF the FET in its secondary winding; an inhibit generation circuit generating an inhibit pulse having a wider pulse width than that of the drive pulse; an AND gate determining a logical product of a continuous pulse from a continuous pulse generation circuit and the inhibit pulse to obtain a power supply pulse train; and a rectifying/smoothing circuit obtaining a direct current voltage corresponding to the power supply pulse train to apply the direct current voltage to the primary winding of the transformer through high resistance.

9 Claims, 13 Drawing Sheets

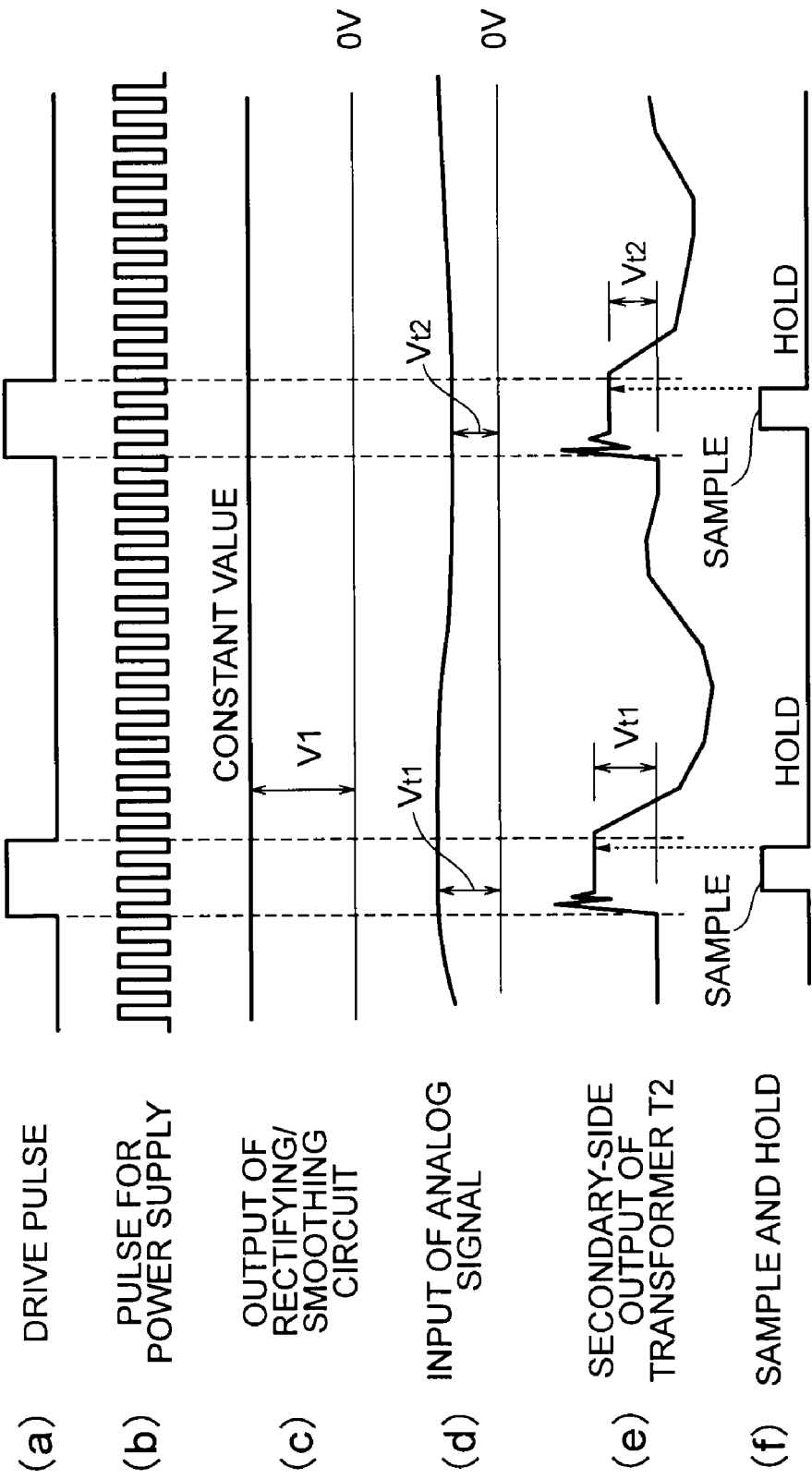

ANALOG MULTIPLEXER WITH INSULATION POWER SUPPLY

TECHNICAL FIELD

The present invention relates to an analog input device which multiplexes and collects a plurality of analog signals sent from a sensor or the like, and more particularly, to an analog multiplexer with an insulated power supply for, for example, detecting disconnection of a sensor or converting a resistance value into an analog voltage.

BACKGROUND ART

When signals sent from a sensor are multiplexed and collected, insulation is made between the sensors and between the sensor and a multiplexer winding ground, and effects of a potential difference therebetween are removed. Therefore, it is also required to insulate a power supply for detecting disconnection of those sensors or converting a resistance value into an analog voltage.

For example, Patent Document 1 describes a method in which, in order to detect disconnection of a thermocouple, a power supply which is generated via an insulation transformer is provided and the power supply is connected to an input end of the thermocouple through high resistance, and an input is made open and a large voltage is applied when the thermocouple is disconnected, to thereby detect the disconnection.

A conventional analog multiplexer is described with reference to FIG. 11 to FIG. 13. FIG. 11 is a diagram illustrating a configuration of a conventional analog input device. FIG. 12 is a diagram illustrating a configuration of the conventional analog multiplexer. Further, FIG. 13 are timing charts illustrating an operation of the conventional analog multiplexer.

In FIG. 11, the conventional analog input device includes a plurality of analog multiplexers 10 respectively connected to analog signal inputs Va (Va1, Va2, Va3, . . . , and Van), a plurality of amplifiers 20, a plurality of switches 30, a sample and hold circuit 40, an AD converter 50, and a drive pulse generation circuit 60 (not shown).

In FIG. 12, the conventional analog multiplexer 10 includes: a continuous pulse generation circuit 11; a buffer 14; a rectifying/smoothing circuit 15; a power supply transformer for multiplexer T1 in which a resistor R1 is connected to a primary winding thereof and the rectifying/smoothing circuit 15 is connected to a secondary winding thereof; an analog signal transformer T2 in which the analog signal input Va is connected to a primary winding thereof and the amplifier 20 is connected to a secondary winding thereof; a drive transformer T3 in which a resistor R2 is connected to a primary winding thereof and a resistor R5 is connected to a secondary winding thereof; a field effect transistor FET1 connected to the secondary winding of the drive transformer T3; a field effect transistor FET2 connected to the drive pulse generation circuit 60; and resistors R3 and R4 connected to a power winding of the rectifying/smoothing circuit 15.

Insulation between the analog signal and the ground is performed by the respective transformers T1, T2, and T3.

Next, the operation of the conventional analog multiplexer is described with reference to the drawings.

In FIG. 12, the field effect transistor FET2 is switched on in response to a drive pulse (see FIG. 13(a)) generated in the drive pulse generation circuit 60 to drive the drive transformer T3, and the field effect transistor FET1 connected to the secondary winding of the drive transformer T3 is switched on. Accordingly, a pulse having an amplitude in accordance with the analog signal input appears in the secondary winding of the analog signal transformer T2.

This pulse is amplified by the amplifier 20, and the amplified pulse is sampled and held at a predetermined timing by the sample and hold circuit 40 to be input to the AD converter 50, whereby analog data can be collected.

The continuous pulse generation circuit 11 is connected to the primary winding of the power supply transformer for multiplexer T1 via the buffer 14, and a pulse train for power supply (continuous pulse) appears in the secondary winding of the power supply transformer for multiplexer T1. The pulse is rectified and smoothed by the rectifying/smoothing circuit 15, and thus a direct current voltage (see FIG. 13(c)) is obtained. The direct current voltage is supplied to both ends of the analog signal input via the resistors R3 and R4 having high resistance.

When the analog signal input is not disconnected, an analog signal Va is input as it is without being affected by the direct current voltage because an analog signal source resistance is small. On the other hand, when the analog signal input is disconnected, the signal source is made open and the direct current voltage is input via the resistors R3 and R4 having high resistance. Then, a pulse voltage which is larger than the analog signal input appears in the secondary winding of the analog signal transformer T2, whereby disconnection thereof can be detected. FIG. 13 illustrate this operation by way of a timing chart.

Patent Document 1: JP 63-113622 A

DISCLOSURE OF THE INVENTION

Problems to be Solved by the Invention

In the conventional analog multiplexer with an insulated power supply as described above, a magnetic field is generated by the power supply transformer T1 in response to the continuous pulse to be driven, whereby the power supply transformer T1 is coupled with the analog signal transformer T2. Therefore, noise is superimposed on the analog signal, which makes it difficult to collect analog data by the multiplexer with high accuracy. Alternatively, as a method of suppressing effects of noise, there is a method of yielding improvement by surrounding the entire transformers with a shield and also eliminating coupling between the transformers and wiring. However, there are a limit to improvement and a problem that a cost is increased due to shield treatment and a dimension for avoiding coupling between wiring is increased.

The present invention has been made to solve the above-mentioned problems, and an object thereof is to provide an analog multiplexer with an insulated power supply which does not require the shield surrounding the entire transformers, and is capable of easily collecting analog data with high precision even in the case of high-density arrangement/wiring.

Means for Solving the Problems

An analog multiplexer with an insulated power supply according to the present invention includes: an analog signal transformer, which receives an input of an analog signal in a primary winding of the analog signal transformer via a first semiconductor switch, and performs ON/OFF driving on the first semiconductor switch, to thereby generate a pulse with an amplitude of the analog signal in a secondary winding of the analog signal transformer; a drive transformer, which receives an input of a drive pulse in a primary winding of the drive transformer via a second semiconductor switch, to thereby generate a pulse for turning ON/OFF the first semiconductor switch in a secondary winding of the drive transformer; an inhibit generation circuit, which generates an inhibit pulse having a pulse width wider than the pulse width of the drive pulse; a continuous pulse generation circuit, which generates a continuous pulse having a pulse width narrower than the pulse width of the drive pulse; an AND gate, which determines a logical product of the inhibit pulse sent from the inhibit generation circuit and the continuous pulse sent from the continuous pulse generation circuit, to thereby obtain a power supply pulse train for driving a primary winding of a power supply transformer; and a rectifying/smoothing circuit connected to a secondary winding of the power supply transformer, which obtains a direct current voltage corresponding to the power supply pulse train, to thereby apply the direct current voltage to the primary winding of the analog signal transformer through high resistance.

EFFECTS OF THE INVENTION

According to the analog multiplexer with an insulated power supply of the present invention, there are obtained such effects that the shield surrounding the entire transformers is not required and analog data can be easily collected with high precision even in the case of high-density arrangement/wiring.

BRIEF DESCRIPTION OF THE DRAWINGS

FIG. 13 are timing charts illustrating an operation of the conventional analog multiplexer.

BEST MODE FOR CARRYING OUT THE INVENTION

The present invention is described below by way of a first embodiment to a fifth embodiment.

First Embodiment

Figure 1:
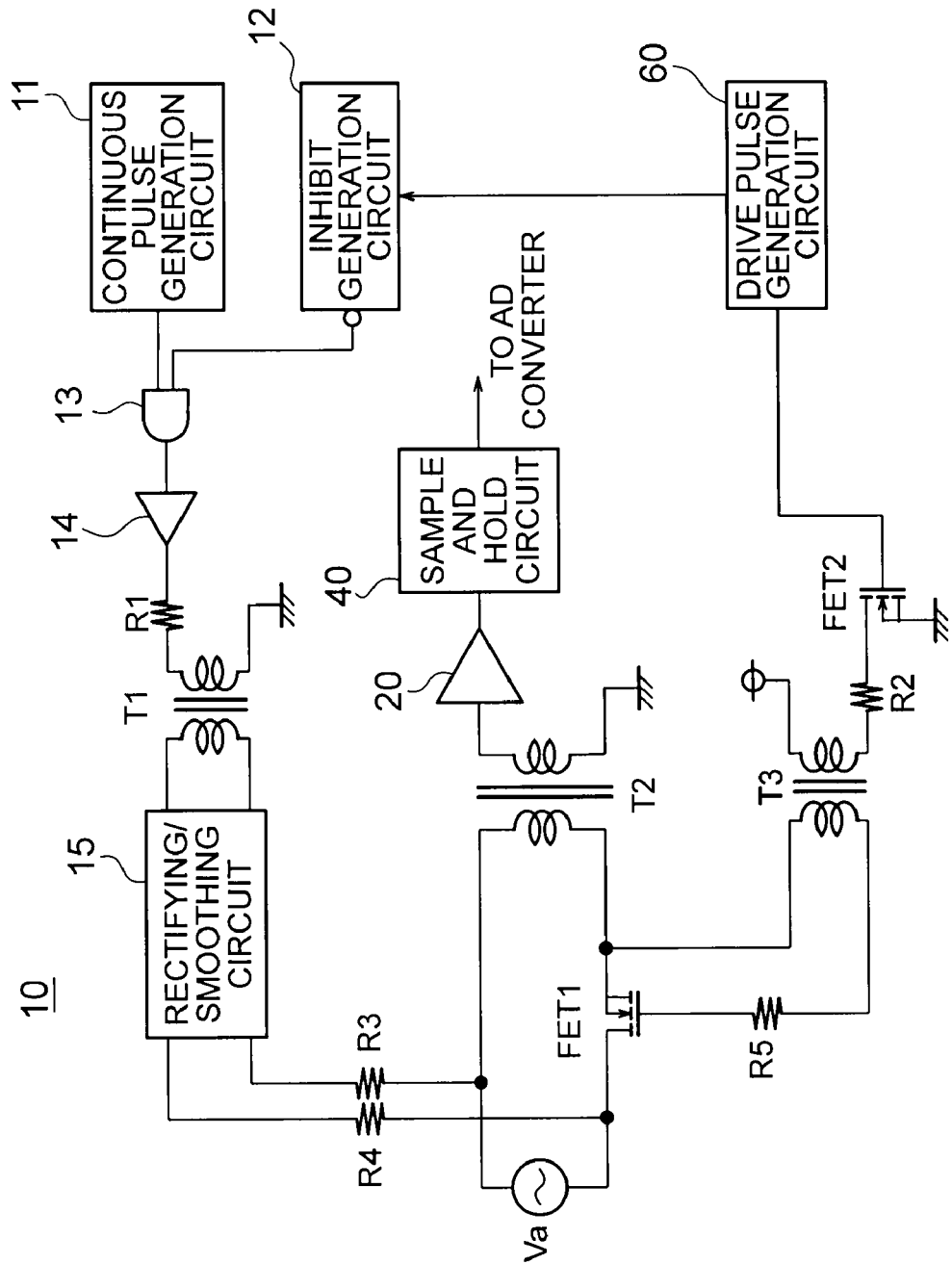
FIG. 1 is a diagram illustrating a configuration of an analog multiplexer with an insulated power supply according to a first embodiment of the present invention.

An analog multiplexer with an insulated power supply according to the first embodiment of the present invention is described with reference to FIG. 1 and FIG. 2. FIG. 1 is a diagram illustrating a configuration of the analog multiplexer with an insulated power supply according to the first embodiment of the present invention. Note that the same reference symbols denote the same or similar components in the respective drawings.

In FIG. 1, an analog multiplexer with an insulated power supply 10 according to the first embodiment of the present invention includes: a continuous pulse generation circuit 11 which generates a continuous pulse having a pulse width narrower than a pulse width of a drive pulse; an inhibit generation circuit 12 which generates an inhibit pulse having a pulse width wider than the pulse width of the drive pulse; an AND gate 13 which determines a logical product of the inhibit pulse sent from the inhibit generation circuit 12 and the continuous pulse sent from the continuous pulse generation circuit 11 to obtain a pulse train for power supply for driving a primary winding of a power supply transformer T1; a buffer 14; a rectifying/smoothing circuit 15 which is connected to a secondary winding of the power supply transformer T1, and obtains a direct current voltage corresponding to the pulse train for power supply to apply the direct current voltage to a primary winding of an analog signal transformer T2 through high resistance; the power supply transformer for multiplexer T1 which has a primary winding connected with a resistor R1 and the secondary winding connected with the rectifying/smoothing circuit 15; the analog signal transformer T2 which has the primary winding connected with an analog signal input Va and a secondary winding connected with an amplifier 20, receives an input of an analog signal in the primary winding thereof via a field effect transistor FET1, and performs ON/OFF driving on the field effect transistor FET1 to generate a pulse with an amplitude of the analog signal in the secondary winding thereof; a drive transformer T3 which has a primary winding connected with a resistor R2 and a secondary winding connected with a resistor R5, and receives an input of the drive pulse via a field effect transistor FET2 in the primary winding thereof to generate a pulse for turning ON/OFF the field effect transistor FET1 in the secondary winding thereof; the field effect transistor (first semiconductor switch) FET1 connected to the secondary winding of the drive transformer T3; the field effect transistor (second semiconductor switch) FET2 connected to a drive pulse generation circuit 60; and resistors R3 and R4 connected to a power winding of the rectifying/smoothing circuit 15.

Next, an operation of the analog multiplexer with an insulated power supply according to the first embodiment is described with reference to the drawings. FIG. 2 are timing charts illustrating the operation of the analog multiplexer with an insulated power supply according to the first embodiment of the present invention.

In FIG. 1, an analog signal Va is input to the primary winding of the analog signal transformer T2 via the field effect transistor FET1, and ON/OFF driving is performed on the field effect transistor FET1, with the result that a pulse with an amplitude of the analog signal input Va is generated in the secondary winding of the analog signal transformer T2.

ON/OFF of the field effect transistor FET1 is in synchronism with a pulse appearing in the secondary winding of the drive transformer T3, that is, with ON/OFF of the field effect transistor FET2 which drives the primary winding of the drive transformer T3, and is controlled by the drive pulse generation circuit 60 connected to an input of the field effect transistor FET2.

Further, the rectifying/smoothing circuit 15 is connected to both ends of the analog signal input Va via the resistors R3 and R4 having high resistance, and a power supply voltage is supplied from the rectifying/smoothing circuit 15 via the resistors R3 and R4 having high resistance in the case where the analog signal is disconnected. Then, a voltage higher than that of the analog signal is applied, whereby the disconnection can be detected.

Meanwhile, in the case where the analog signal is not disconnected, an analog signal source resistance is generally small, and thus the analog signal is not affected by currents from the resistors R3 and R4 having high resistance. The rectifying/smoothing circuit 15 is connected to the secondary winding of the power supply transformer for multiplexer T1, and generates a voltage in response to a pulse train for power supply, which drives the primary winding of the power supply transformer for multiplexer T1. The pulse train for driving the power supply transformer for multiplexer T1 is configured so as to be obtained on AND conditions of outputs of the continuous pulse generation circuit 11 and the inhibit generation circuit 12. Note that the inhibit generation circuit 12 generates an inhibit signal based on the drive pulse sent from the drive pulse generation circuit 60.

Figure 2:
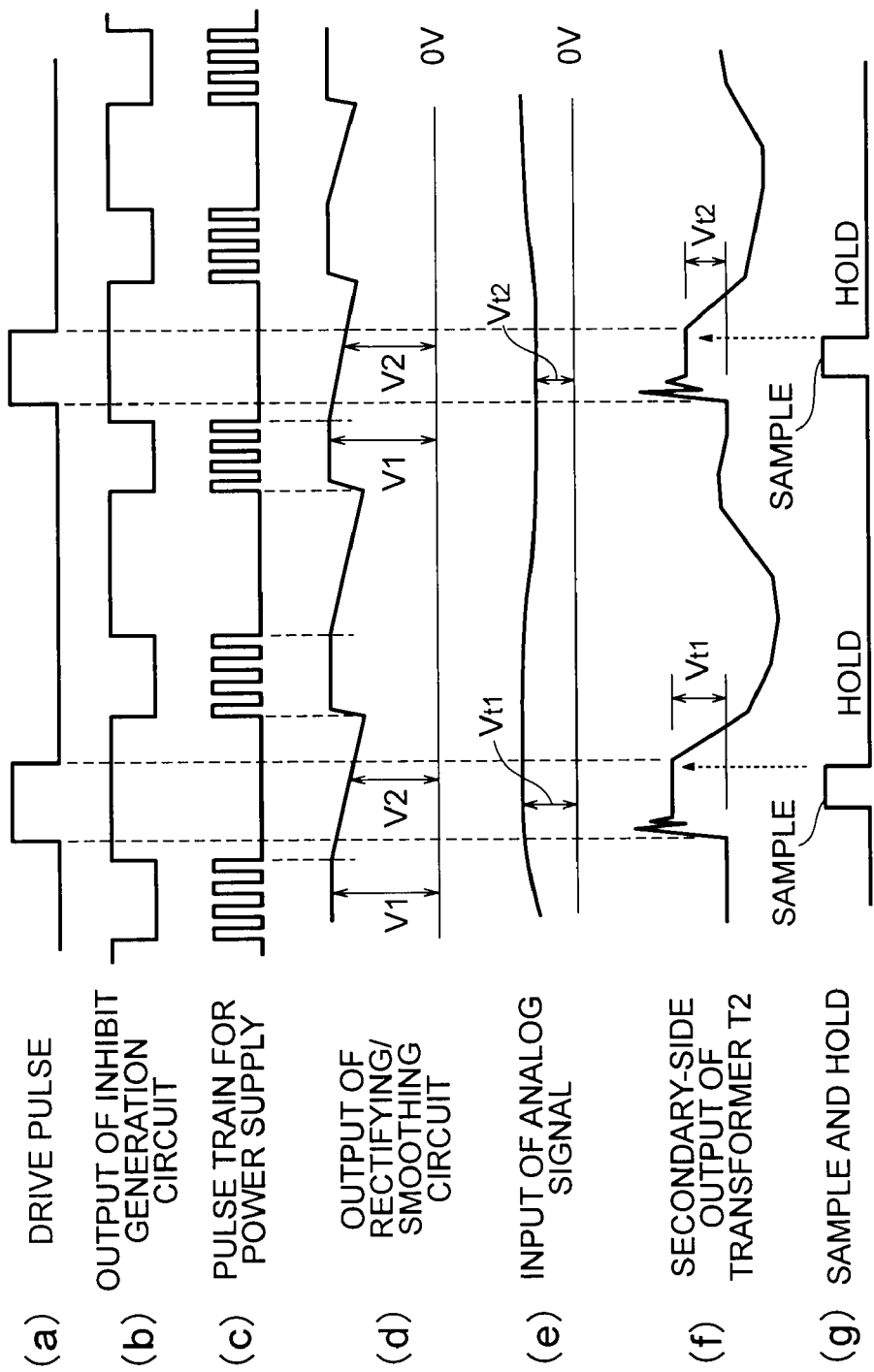
FIG. 2 are timing charts illustrating an operation of the analog multiplexer with an insulated power supply according to the first embodiment of the present invention.

FIG. 2 illustrate timing waveforms of the above-mentioned components. In FIG. 2, the inhibit signal is generated so as to be allowed to have a predetermined time from both edges of the drive pulse, to thereby stop the continuous pulse and perform an intermittent operation for avoiding biased magnetization of the transformer. Even during the intermittent operation, if a current is small to an extent that disconnection of the analog signal is detected with high resistance, a sufficient voltage V2 can be secured even when a voltage drops, due to discharge until a hold timing at which the analog signal is actually taken in, from an output V1 of the rectifying/smoothing circuit while the power supply pulse is being supplied.

Figure 11:
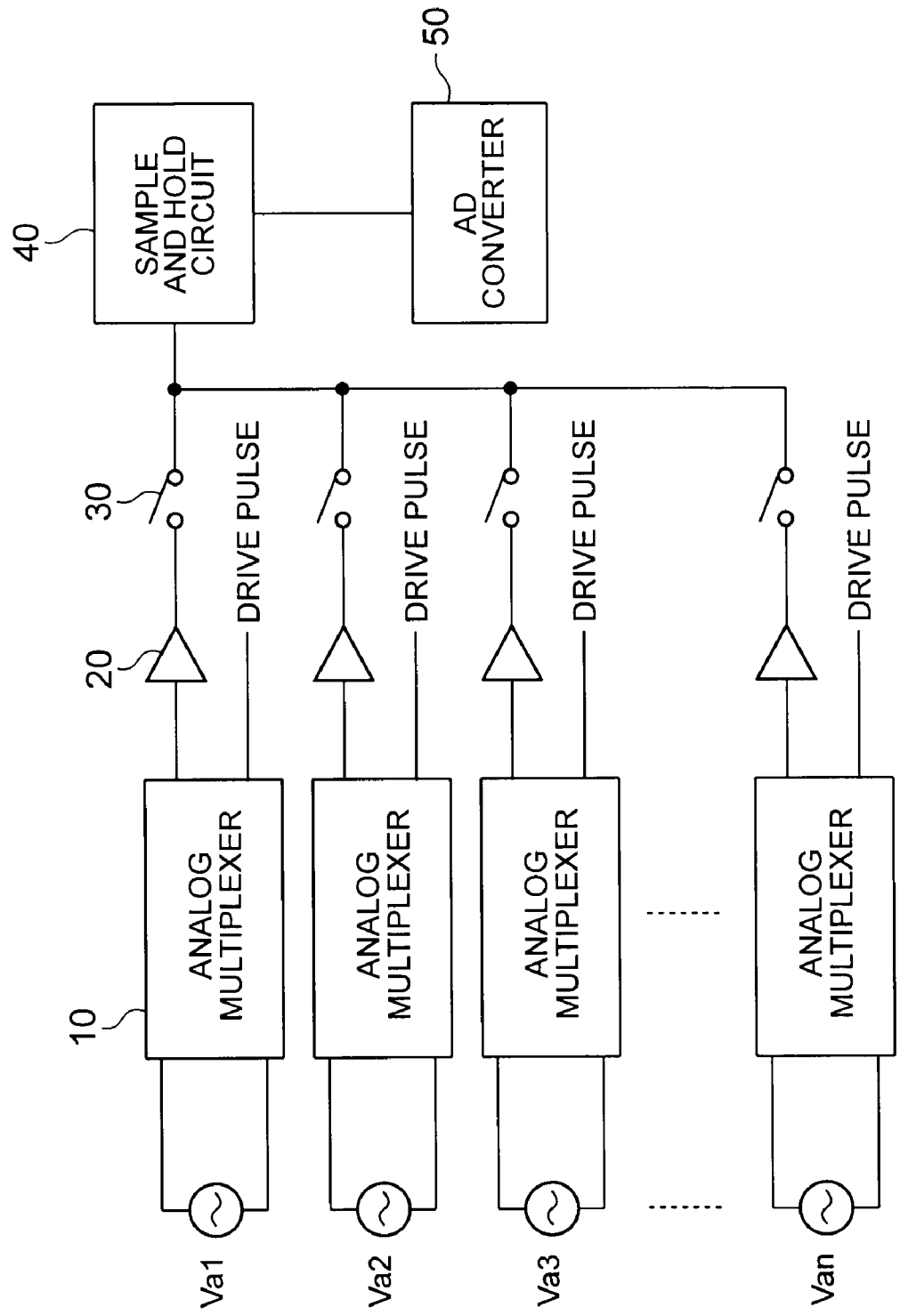
FIG. 11 is a diagram illustrating a configuration of a conventional analog input device.
Figure 12:
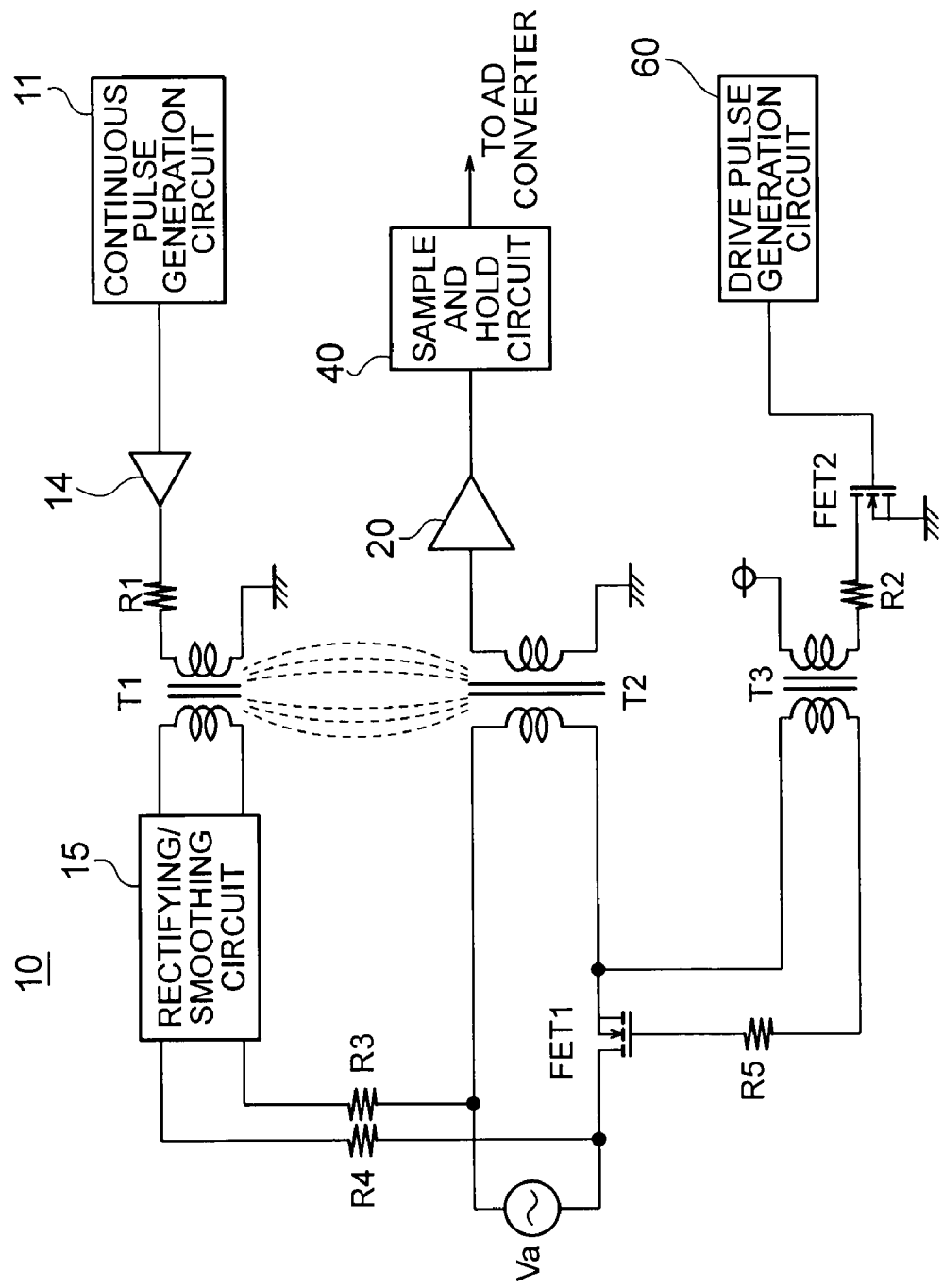
FIG. 12 is a diagram illustrating a configuration of a conventional analog multiplexer.

The configuration described above is made to be a general multiplexer configuration with multiple points as illustrated in FIG. 11. As a result, insulation power supply is supplied to the respective analog points, and the analog signals are multiplexed, whereby analog data can be collected.

As described above, the pulse train for power supply which is configured to drive the power supply transformer for multiplexer T1 is being stopped when an output of the analog signal transformer T2 is shifted from a sample state to a hold state. Accordingly, even when there is magnetic field coupling between the power supply transformer for multiplexer T1 and the analog signal transformer T2, noise induction can be avoided. This is particularly effective in the case of a thermocouple which is susceptible to noise, for example, an input at a minute level.

Second Embodiment

Figure 3:
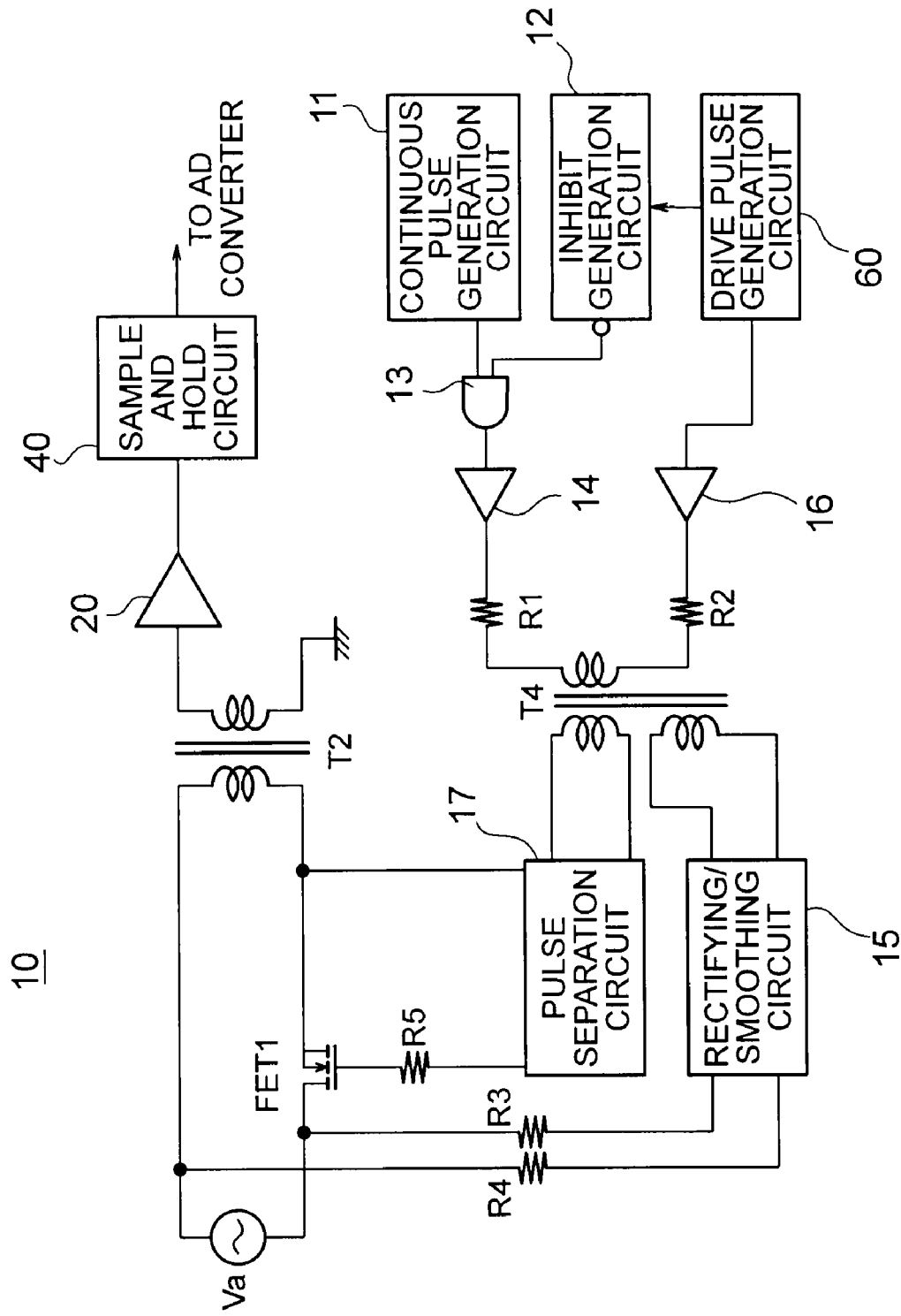
FIG. 3 is a diagram illustrating a configuration of an analog multiplexer with an insulated power supply according to a second embodiment of the present invention.

An analog multiplexer with an insulated power supply according to the second embodiment of the present invention is described with reference to FIG. 3 to FIG. 5. FIG. 3 is a diagram illustrating a configuration of the analog multiplexer with an insulated power supply according to the second embodiment of the present invention.

In FIG. 3, an analog multiplexer with an insulated power supply 10 according to the second embodiment of the present invention includes: a continuous pulse generation circuit 11 which generates a continuous pulse having a pulse width narrower than the pulse width of a drive pulse; an inhibit generation circuit 12 which generates an inhibit pulse having a pulse width wider than the pulse width of the drive pulse; an AND gate 13 which determines a logical product of the inhibit pulse sent from the inhibit generation circuit 12 and the continuous pulse sent from the continuous pulse generation circuit 11 to obtain an intermittent pulse train; a buffer 14; a rectifying/smoothing circuit 15 which is connected to a second secondary winding of a combined transformer T4, and obtains a direct current voltage corresponding to the intermittent pulse train to apply the direct current voltage to a primary winding of an analog signal transformer T2 through high resistance; a buffer 16; a pulse separation circuit 17 which separates only the drive pulse from a combined pulse appearing in a first secondary winding of the combined transformer T4 to generate a pulse for causing a field effect transistor FET1 connected to the primary winding of the analog signal transformer T2 to be turned ON/OFF; the analog signal transformer T2 which has the primary winding connected with an analog signal input Va and a secondary winding connected with an amplifier 20, receives an input of an analog signal in the primary winding thereof via the field effect transistor FET1, and performs ON/OFF driving on the field effect transistor FET1 to generate a pulse with an amplitude of the analog signal in the secondary winding thereof; the combined transformer T4 which has a primary winding connected with a resistor R1 and a resistor R2 and the secondary windings respectively connected with the rectifying/smoothing circuit 15 and the pulse separation circuit 17, functions as both a power supply transformer and a drive transformer, and receives the drive pulse and the intermittent pulse train on one side and the other side of the primary winding thereof, respectively, to generate a combined pulse in which the drive pulse and the intermittent pulse train are combined with each other in the first and second secondary windings thereof; the field effect transistor (semiconductor switch) FET1 connected to the pulse separation circuit 17 via a resistor R5; and resistors R3 and R4 connected to a power winding of the rectifying/smoothing circuit 15.

Figure 4:
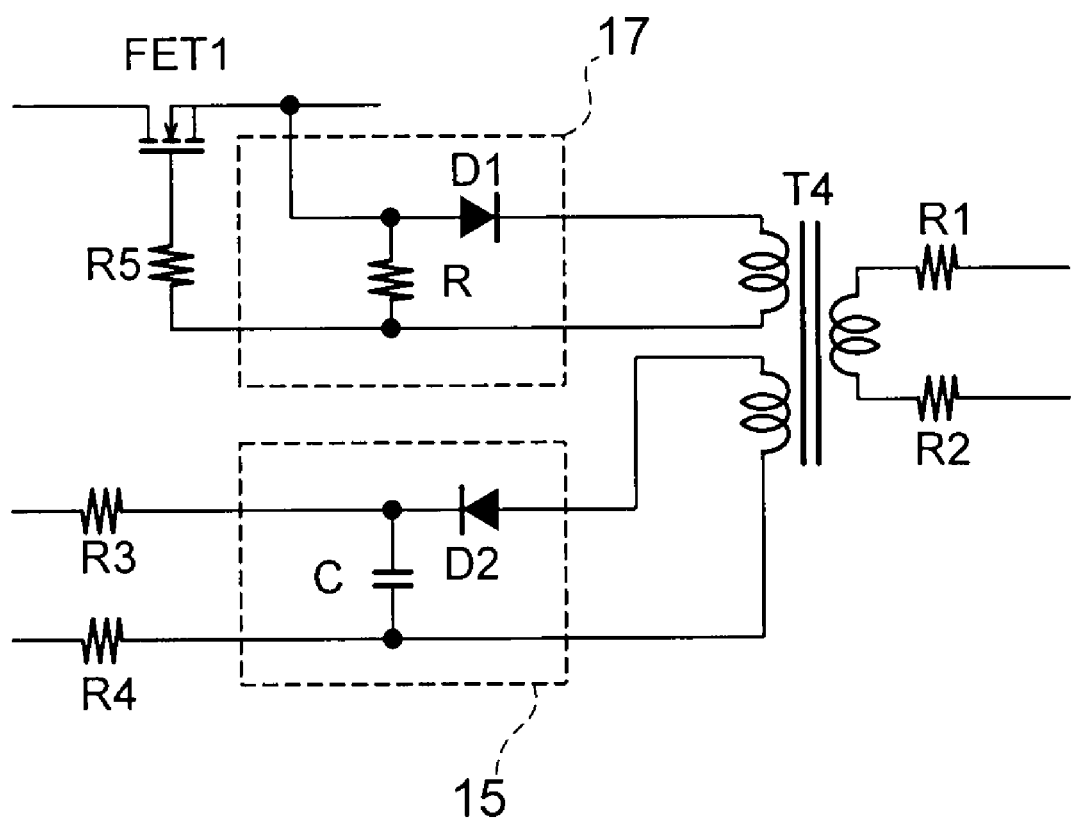
FIG. 4 is a diagram illustrating a configuration of a rectifying/smoothing circuit and a pulse separation circuit of the analog multiplexer with an insulated power supply according to the second embodiment of the present invention.

FIG. 4 is a diagram illustrating a configuration of the rectifying/smoothing circuit and the pulse separation circuit of the analog multiplexer with an insulated power supply according to the second embodiment of the present invention. In FIG. 4, the rectifying/smoothing circuit 15 includes a diode D2 and a capacitor C. The pulse separation circuit 17 includes a diode D1 and a resistor R.

Next, an operation of the analog multiplexer with an insulated power supply according to the second embodiment of the present invention is described with reference to the drawings. FIG. 5 are timing charts illustrating the operation of the analog multiplexer with an insulated power supply according to the second embodiment of the present invention.

In FIG. 3, the second embodiment is similar to the above-mentioned first embodiment in that an analog signal Va is input to the primary winding of the analog signal transformer T2 via the field effect transistor FET1, and ON/OFF driving is performed on the field effect transistor FET1, whereby a pulse with an amplitude of an analog signal input voltage is generated in the secondary winding of the analog signal transformer T2.

A waveform illustrated in FIG. 5(d) appears on an output of the secondary windings of the combined transformer T4. A negative-side pulse is extracted through polarity separation of the diode D1 of the pulse separation circuit 17, and the drive pulse is supplied between a gate and a source of the field effect transistor FET1, whereby the field effect transistor FET1 is brought into conduction. Note that the load resistor R functions to shape waveforms. A positive-side pulse is extracted through polarity separation of the diode D2 of the rectifying/smoothing circuit 15, and the direct current voltage is taken out by charging the capacitor C. Power is fed to the analog signal input via the resistors R3 and R4 having high resistance in response to the direct current voltage, and thus disconnection is detected.

In the second embodiment described here, as described above, the drive pulse and the intermittent pulse for power supply are each applied to the both ends of the primary winding of the combined transformer T4, and in response to those pulses, the combined transformer T4 is driven at a timing at which those pulses do not overlap each other. In other words, when an output signal is generated from a drive pulse generation circuit 60, the intermittent pulse for power supply is in a dormant state and the buffer 16 is in an "L" state. Then, only the drive pulse is separated from a pulse (combined pulse in which the drive pulse and the power supply pulse are combined with each other) appearing in the secondary winding of the combined transformer T4 by the pulse separation circuit 17, and a pulse for turning ON/OFF the field effect transistor FET1 is generated.

Meanwhile, the power supply pulse for driving the primary winding of the combined transformer T4 is an intermittent pulse train obtained on AND conditions of the respective outputs of the continuous pulse generation circuit 11 and the inhibit generation circuit 12. While the combined transformer T4 is being driven in response to the power supply pulse, the drive pulse is in the dormant state and the buffer 14 is in the "L" state. Then, the rectifying/smoothing circuit 15 for the secondary winding of the combined transformer T4 functions to separately extract only the power supply pulse and to rectify and smooth the power supply pulse to take out the direct current voltage. Then, the obtained direct current voltage is supplied to both ends of the analog signal input Va via the resistors R3 and R4 having high resistance, which enables detecting the disconnection of the analog signal input.

Figure 5:
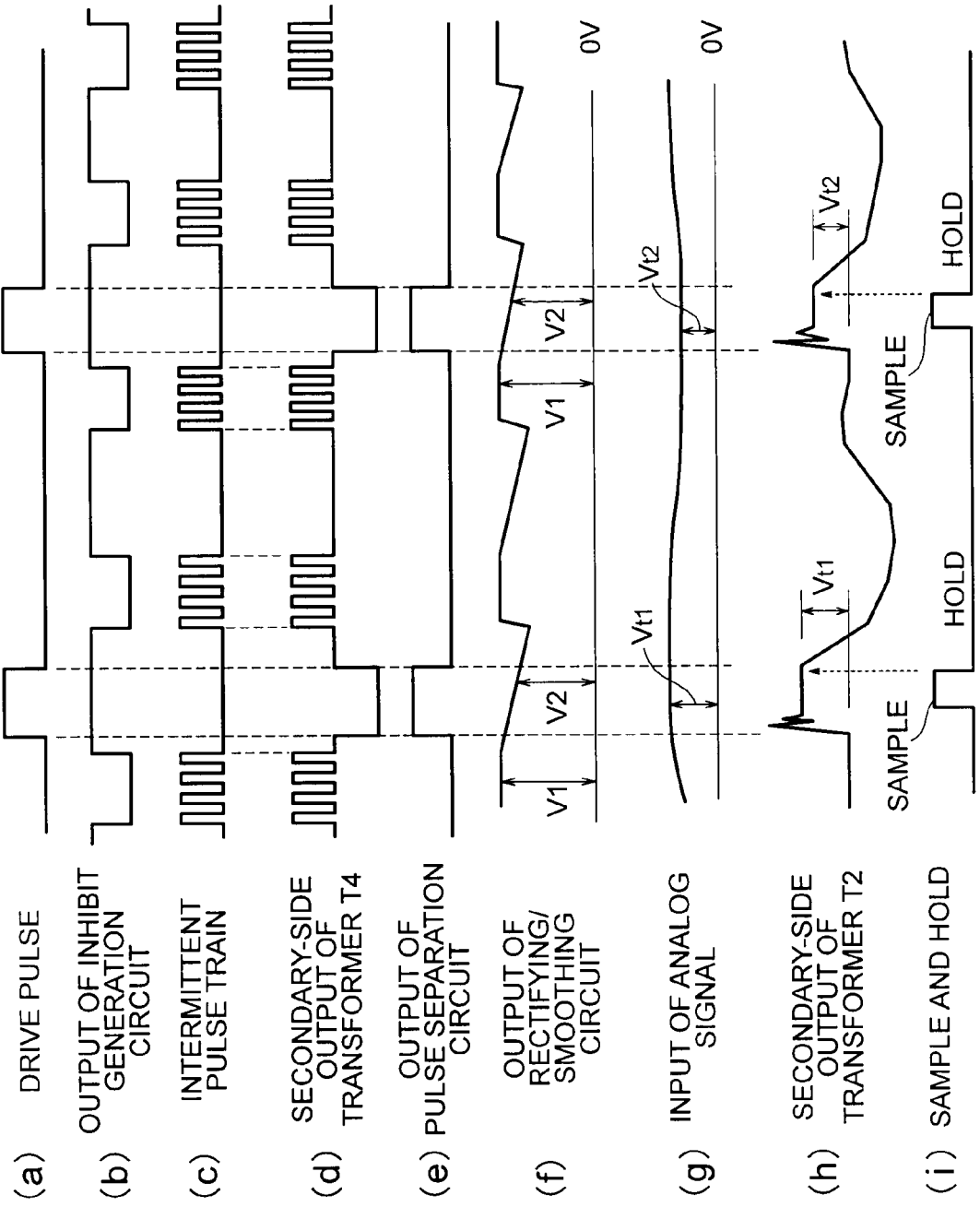
FIG. 5 are timing charts illustrating an operation of the analog multiplexer with an insulated power supply according to the second embodiment of the present invention.

FIG. 5 are timing charts according to the second embodiment. In the output waveform of the secondary windings of the combined transformer T4, components of the power supply pulse and the drive pulse appear in a positive direction and a negative direction, respectively. Waveforms other than the above-mentioned portion are similar to those of the first embodiment described above.

Third Embodiment

Figure 6:
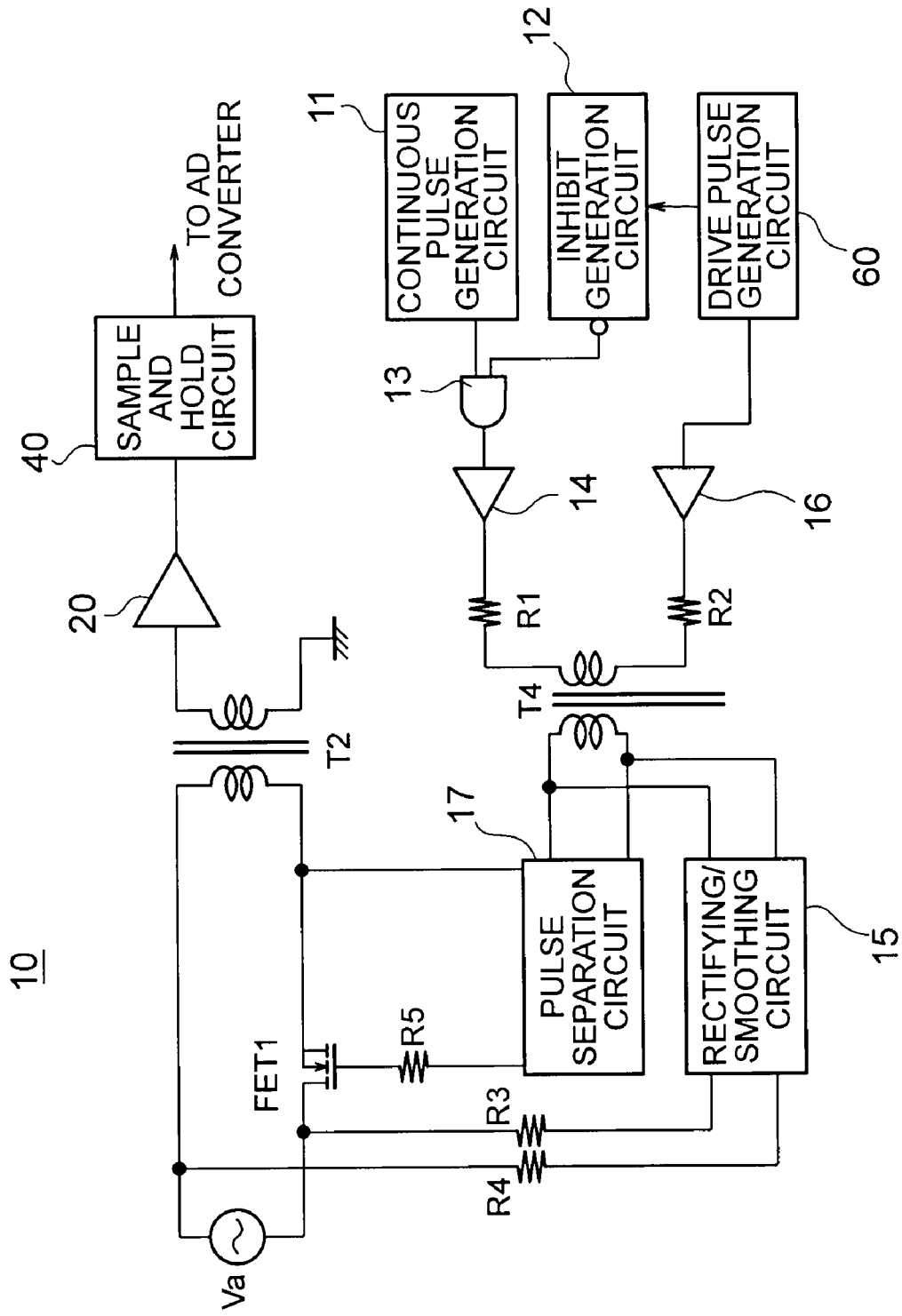
FIG. 6 is a diagram illustrating a configuration of an analog multiplexer with an insulated power supply according to a third embodiment of the present invention.

An analog multiplexer with an insulated power supply according to the third embodiment of the present invention is described with reference to FIG. 6 and FIG. 7. FIG. 6 is a diagram illustrating a configuration of the analog multiplexer with an insulated power supply according to the third embodiment of the present invention.

In FIG. 6, an analog multiplexer with an insulated power supply 10 according to the third embodiment of the present invention includes: a continuous pulse generation circuit 11 which generates a continuous pulse having a pulse width narrower than a pulse width of a drive pulse; an inhibit generation circuit 12 which generates an inhibit pulse having a pulse width wider than the pulse width of the drive pulse; an AND gate 13 which determines a logical product of the inhibit pulse sent from the inhibit generation circuit 12 and the continuous pulse sent from the continuous pulse generation circuit 11 to obtain an intermittent pulse train; a buffer 14; a rectifying/smoothing circuit 15 which is connected to a secondary winding of a combined transformer T5, and obtains a direct current voltage corresponding to the intermittent pulse train to apply the direct current voltage to a primary winding of an analog signal transformer T2 through high resistance; a buffer 16; a pulse separation circuit 17 which separates only the drive pulse from a combined pulse appearing in the secondary winding of the combined transformer T5 to generate a pulse for causing a field effect transistor FET1 connected to the primary winding of the analog signal transformer T2 to be turned ON/OFF; the analog signal transformer T2 which has the primary winding connected with an analog signal input Va and a secondary winding connected with an amplifier 20, receives an input of an analog signal in the primary winding thereof via the field effect transistor FET1, and performs ON/OFF driving on the field effect transistor FET1 to generate a pulse with an amplitude of the analog signal in the secondary winding thereof; the combined transformer T5 which has a primary winding connected with a resistor R1 and a resistor R2 and the secondary winding connected with the rectifying/smoothing circuit 15 and the pulse separation circuit 17, functions as both a power supply transformer and a drive transformer, and receives the drive pulse and the intermittent pulse train on one side and the other side of the primary winding thereof, respectively, to generate a combined pulse in which the drive pulse and the intermittent pulse train are combined with each other in the secondary winding thereof; the field effect transistor (semiconductor switch) FET1 connected to the pulse separation circuit 17 via a resistor R5; and resistors R3 and R4 connected to a power winding of the rectifying/smoothing circuit 15.

Figure 7:
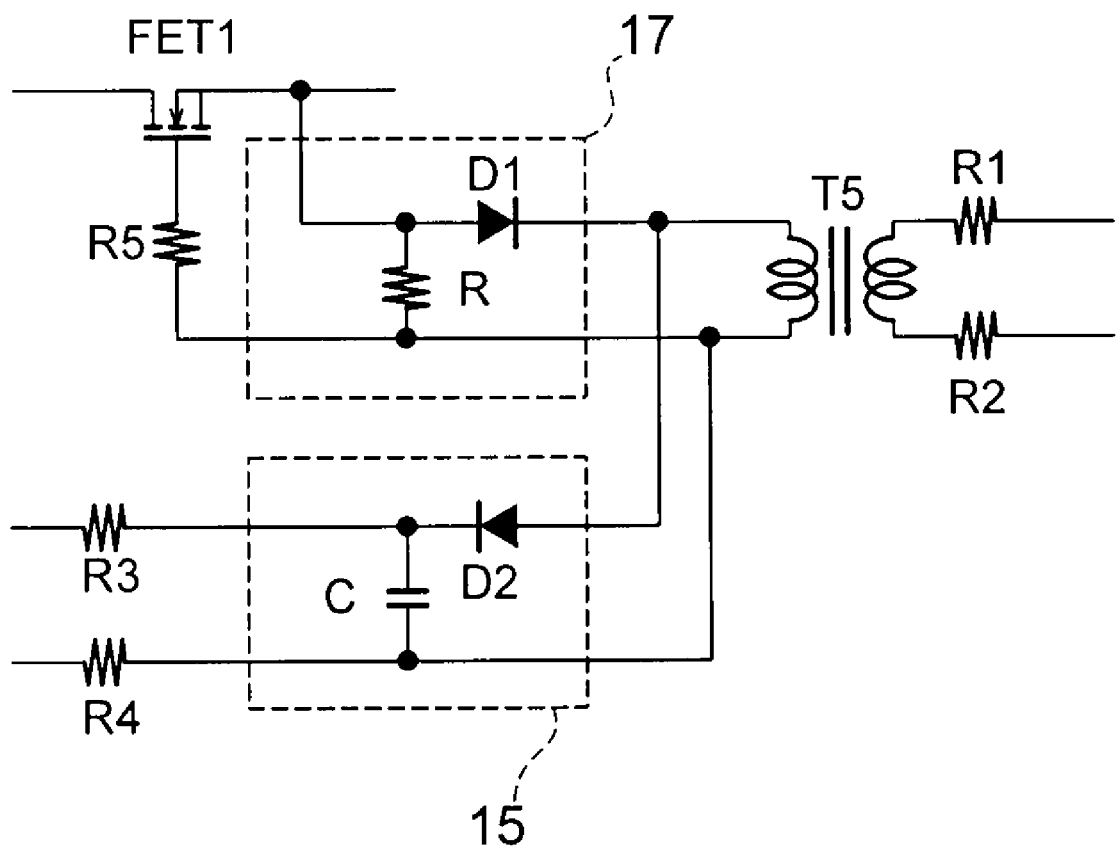
FIG. 7 is a diagram illustrating a configuration of a rectifying/smoothing circuit and a pulse separation circuit of the analog multiplexer with an insulated power supply according to the third embodiment of the present invention.

FIG. 7 is a diagram illustrating a configuration of the rectifying/smoothing circuit and the pulse separation circuit of the analog multiplexer with an insulated power supply according to the third embodiment of the present invention. In FIG. 7, the rectifying/smoothing circuit 15 includes a diode D2 and a capacitor C. The pulse separation circuit 17 includes a diode D1 and a resistor R.

Next, an operation of the analog multiplexer with an insulated power supply according to the third embodiment of the present invention is described with reference to the drawings.

In FIG. 6, the third embodiment is similar to the above-mentioned first and second embodiments in that an analog signal Va is input to the primary winding of the analog signal transformer T2 via the field effect transistor FET1, and ON/OFF driving is performed on the field effect transistor FET1, whereby a pulse with an amplitude of an analog signal input voltage is generated in the secondary winding of the analog signal transformer T2.

A waveform illustrated in FIG. 5(d) appears on an output of the secondary winding of the combined transformer T5. A negative-side pulse is extracted through polarity separation of the diode D1 of the pulse separation circuit 17, and the drive pulse is supplied between a gate and a source of the field effect transistor FET1, whereby the field effect transistor FET1 is brought into conduction. Note that the load resistor R functions to shape waveforms. A positive-side pulse is extracted through polarity separation of the diode D2 of the rectifying/smoothing circuit 15, and the direct current voltage is taken out by charging the capacitor C. Power is fed to the analog signal input via the resistors R3 and R4 having high resistance in response to the direct current voltage, and thus disconnection is detected.

As described above, the drive pulse and the power supply pulse are each applied to the both ends of the primary winding of the combined transformer T5, and the combined transformer T5 is driven at a timing at which the drive pulse and the power supply pulse do not overlap each other. This is similar to the case of the second embodiment described above.

In the third embodiment, the secondary winding of the combined transformer T5 has only one system, and is shared between the drive pulse and the power supply pulse. The drive pulse is separated from a pulse (pulse in which the drive pulse and the power supply pulse are combined with each other) appearing in the secondary winding of the combined transformer T5 by the pulse separation circuit 17, and the power supply pulse is separated therefrom by the rectifying/smoothing circuit 15.

The field effect transistor FET1 is turned ON/OFF in response to the separated drive pulse, and the direct current voltage sent from the rectifying/smoothing circuit 15 is connected to the both ends of the analog signal input Va via the resistors R3 and R4 having high resistance. The timing charts on this occasion are similar to those of FIG. 5 described in the second embodiment.

Fourth Embodiment

Figure 8:
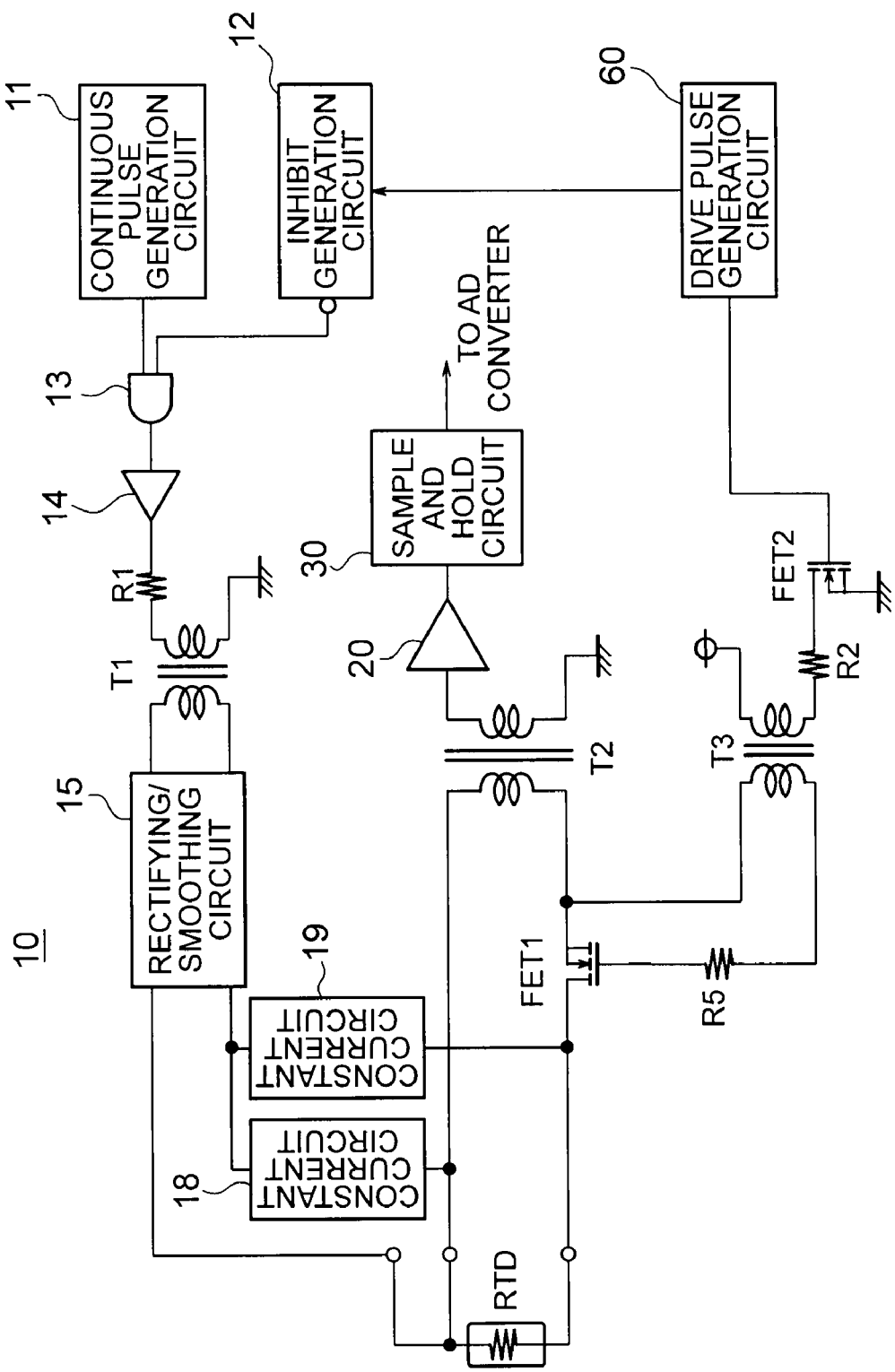
FIG. 8 is a diagram illustrating a configuration of an analog multiplexer with an insulated power supply according to a fourth embodiment of the present invention.

An analog multiplexer with an insulated power supply according to the fourth embodiment of the present invention is described with reference to FIG. 8 and FIG. 9. FIG. 8 is a diagram illustrating a configuration of the analog multiplexer with an insulated power supply according to the fourth embodiment of the present invention.

In FIG. 8, an analog multiplexer with an insulated power supply 10 according to the fourth embodiment of the present invention includes: a continuous pulse generation circuit 11 which generates a continuous pulse having a pulse width narrower than a pulse width of a drive pulse; an inhibit generation circuit 12 which generates an inhibit signal configured to generate a timing at which only the pulse width of the drive pulse for driving a field effect transistor FET1 is inhibited; an AND gate 13 which determines a logical product of the inhibit signal sent from the inhibit generation circuit 12 and the continuous pulse sent from the continuous pulse generation circuit 11 to obtain an intermittent pulse train for driving a primary winding of a power supply transformer so as to form a continuous pulse train during a period other than a period corresponding to the pulse width of the drive pulse; a buffer 14; a rectifying/smoothing circuit 15 which is connected to a secondary winding of the power supply transformer T1, and obtains a direct current voltage corresponding to the intermittent pulse train to apply the direct current voltage to a primary winding of an analog signal transformer T2 via constant current circuits 18 and 19; the power supply transformer for multiplexer T1 which has the primary winding connected with a resistor R1 and the secondary winding connected with the rectifying/smoothing circuit 15; the analog signal transformer T2 which has the primary winding connected with an analog signal input Va and a secondary winding connected with an amplifier 20, receives an input of an analog signal via the field effect transistor FET1 in the primary winding thereof, and performs ON/OFF driving on the field effect transistor FET1 to generate a pulse with an amplitude of the analog signal in the secondary winding thereof; a drive transformer T3 which has a primary winding connected with a resistor R2 and a secondary winding connected with a resistor R5, and receives an input of the drive pulse via a field effect transistor FET2 in the primary winding thereof to generate a pulse for turning ON/OFF the field effect transistor FET1 in the secondary winding thereof; the field effect transistor (first semiconductor switch) FET1 connected to the secondary winding of the drive transformer T3; the field effect transistor (second semiconductor switch) FET2 connected to a drive pulse generation circuit 60; constant current circuits 18 and 19 connected to a power winding of the rectifying/smoothing circuit 15; and a resistance temperature detector RTD whose resistance varies in accordance with temperature.

Next, an operation of the analog multiplexer with an insulated power supply according to the fourth embodiment of the present invention is described with reference to the drawings. FIG. 9 are timing charts illustrating the operation of the analog multiplexer with an insulated power supply according to the fourth embodiment of the present invention.

In FIG. 8, a constant current is caused to flow from the rectifying/smoothing circuit 15 to the resistance temperature detector RTD via the constant current circuits 18 and 19, whereby a resistance change of the resistance temperature detector RTD is converted into an analog signal voltage Va. Then, the voltage Va is input to the primary winding of the analog signal transformer T2 via the field effect transistor FET1. The fourth embodiment is similar to the above-mentioned first to third embodiments in that the ON/OFF driving is performed on the field effect transistor FET1, whereby a pulse with an amplitude of the analog signal input voltage is generated in the secondary winding of the analog signal transformer T2.

Moreover, the fourth embodiment is similar to the above-mentioned first embodiment in that the rectifying/smoothing circuit 15 operates at a timing obtained on AND conditions of respective outputs of the drive pulse generation circuit 60 which controls ON/OFF of the field effect transistor FET1 via the drive transformer T3, the inhibit generation circuit 12, and the continuous pulse generation circuit 11.

In the fourth embodiment, the configuration is made so that the current is supplied from the rectifying/smoothing circuit 15 to an input of the resistance temperature detector RTD via the constant current circuits 18 and 19. As to the configuration as described above, it is desirable that the voltage from the rectifying/smoothing circuit 15 be as constant as possible, and hence a sufficiently stable voltage cannot be supplied by the power supply pulse of the intermittent operation illustrated in FIG. 2(c) according to the first embodiment.

Figure 9:
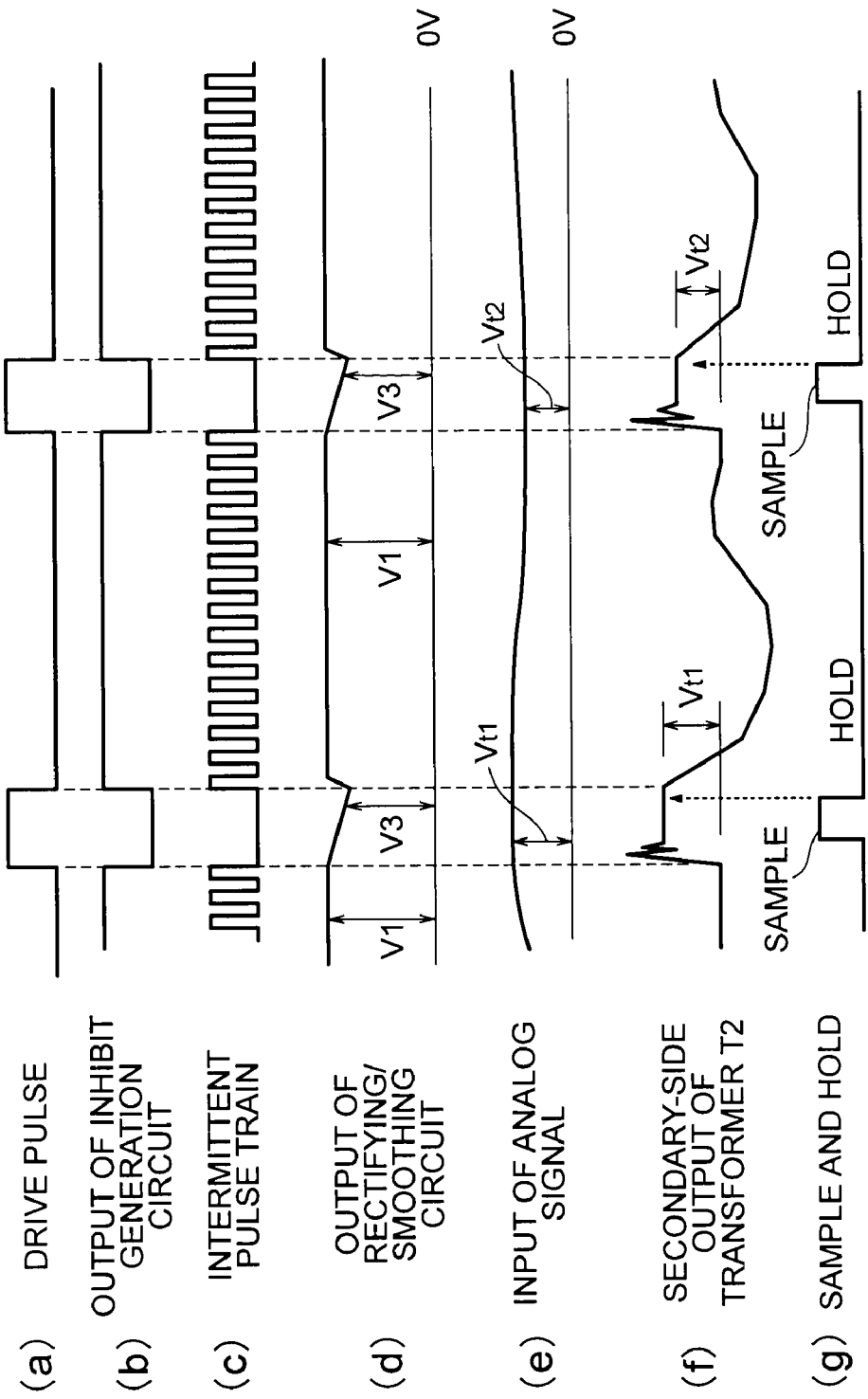
FIG. 9 are timing charts illustrating an operation of the analog multiplexer with an insulated power supply according to the fourth embodiment of the present invention.

Therefore, in the fourth embodiment, the power supply pulse is caused to stop while the drive pulse appears, and the continuous pulse is caused to be output at other timing as illustrated in FIG. 9, with the result that the voltage from the rectifying/smoothing circuit 15 is stabilized.

As described above, also in the fourth embodiment as in the cases of the above-mentioned first to third embodiments, the pulse train for power supply which drives the power supply transformer for multiplexer T1 is being stopped when the output of the analog signal transformer T2 is shifted from sample to hold. Accordingly, noise induction can be avoided even when there is magnetic field coupling between the power supply transformer T1 and the analog signal transformer T2.

Fifth Embodiment

Figure 10:
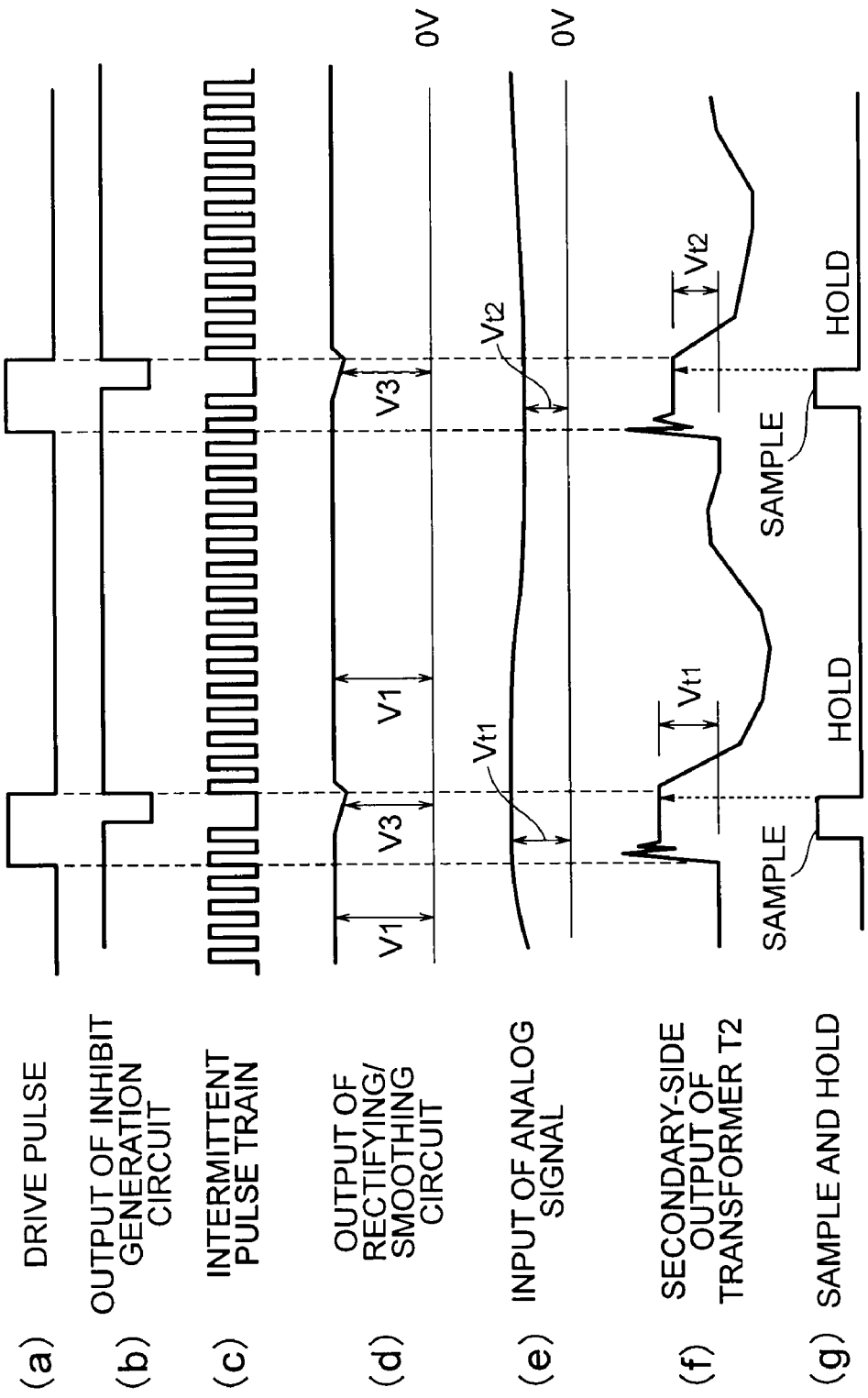
FIG. 10 are timing charts illustrating an operation of an analog multiplexer with an insulated power supply according to a fifth embodiment of the present invention.

An analog multiplexer with an insulated power supply according to the fifth embodiment of the present invention is described with reference to FIG. 10. FIG. 10 are timing charts illustrating an operation of the analog multiplexer with an insulated power supply according to the fifth embodiment of the present invention. Note that a configuration of the analog multiplexer with an insulated power supply according to the fifth embodiment of the present invention is similar to that of the fourth embodiment described above.

In FIG. 8, when a voltage from the rectifying/smoothing circuit 15 is kept as constant as possible, a sufficiently stable voltage may not be obtained even during a power supply pulse stop period as illustrated in FIG. 9 of the above-mentioned fourth embodiment with respect to a large current such as a large current flowing through the constant current circuits 18 and 19.

In such a case, an output of the inhibit generation circuit 12 is made to be narrower than the drive pulse as illustrated in FIG. 10, and stop time of the power supply pulse is shortened, whereby the voltage from the rectifying/smoothing circuit 15 can be stabilized. In this case, in a sample and hold circuit 40, the pulse width of the inhibit signal is narrowed to an extent that the analog voltage to be actually held is not affected by noise of the power supply pulse.

That is, the inhibit generation circuit 12 is configured to generate a timing of inhibition around a timing at which the sample and hold circuit 40 is shifted from the sample state to the hold state. A logical product of the inhibit signal sent from the inhibit generation circuit 12 and the continuous pulse sent from the continuous pulse generation circuit 11 is determined, whereby the intermittent pulse train is stopped around a timing at which the sample and hold circuit 40 is shifted from the sample state to the hold state, and is changed into the continuous pulse train at timing other than the above-mentioned timing.

The invention claimed is:

1. An analog multiplexer with an insulated power supply, comprising:
   an analog signal transformer, which receives an input of an analog signal in a primary winding of the analog signal transformer via a first semiconductor switch, and performs ON/OFF driving on the first semiconductor switch, to thereby generate a pulse with an amplitude of the analog signal in a secondary winding of the analog signal transformer;
   a drive transformer, which receives an input of a drive pulse in a primary winding of the drive transformer via a second semiconductor switch, to thereby generate a pulse for turning ON/OFF the first semiconductor switch in a secondary winding of the drive transformer;
   an inhibit generation circuit, which generates an inhibit pulse having a pulse width wider than a pulse width of the drive pulse;
   a continuous pulse generation circuit, which generates a continuous pulse having a pulse width narrower than the pulse width of the drive pulse;
   an AND gate, which determines a logical product of the inhibit pulse sent from the inhibit generation circuit and the continuous pulse sent from the continuous pulse generation circuit, to thereby obtain a power supply pulse train for driving a primary winding of a power supply transformer; and
   a rectifying/smoothing circuit connected to a secondary winding of the power supply transformer, which obtains a direct current voltage corresponding to the power supply pulse train, to thereby apply the direct current voltage to the primary winding of the analog signal transformer through high resistance.

2. An analog multiplexer with an insulated power supply, comprising:
   an analog signal transformer, which receives an input of an analog signal in a primary winding of the analog signal transformer via a semiconductor switch, and performs ON/OFF driving on the semiconductor switch, to thereby generate a pulse with an amplitude of the analog signal in a secondary winding of the analog signal transformer;
   an inhibit generation circuit, which generates an inhibit pulse having a pulse width wider than a pulse width of the drive pulse;
   a continuous pulse generation circuit, which generates a continuous pulse having a pulse width narrower than a pulse width of the drive pulse;
   an AND gate, which determines a logical product of the inhibit pulse sent from the inhibit generation circuit and the continuous pulse sent from the continuous pulse generation circuit, to thereby obtain an intermittent pulse train;
   a combined transformer, which receives an input of the drive pulse on one side of a primary winding of the combined transformer, and receives an input of the intermittent pulse train on another side of the primary winding of the combined transformer, to thereby generate a combined pulse in which the drive pulse and the intermittent pulse train are combined with each other in a first secondary winding and a second secondary winding of the combined transformer;
   a pulse separation circuit, which separates only the drive pulse from the combined pulse appearing in the first secondary winding of the combined transformer, to thereby generate a pulse for turning ON/OFF the semiconductor switch connected to the primary winding of the analog signal transformer; and
   a rectifying/smoothing circuit connected to the second secondary winding of the combined transformer, which obtains a direct current voltage corresponding to the intermittent pulse train, to thereby apply the direct current voltage to the primary winding of the analog signal transformer through high resistance.

3. An analog multiplexer with an insulated power supply according to claim 2, wherein the rectifying/smoothing circuit removes the drive pulse through polarity separation to obtain the direct current voltage corresponding to the intermittent pulse train.

4. An analog multiplexer with an insulated power supply according to claim 2, wherein the pulse separation circuit removes the intermittent pulse train from the drive pulse generated by the combined transformer through polarity separation of a diode to supply the drive pulse between control input terminals of the semiconductor switch.

5. An analog multiplexer with an insulated power supply, comprising:
   an analog signal transformer, which receives an input of an analog signal in a primary winding of the analog signal transformer via a semiconductor switch, and performs ON/OFF driving on the semiconductor switch, to thereby generate a pulse with an amplitude of the analog signal in a secondary winding of the analog signal transformer;
   an inhibit generation circuit, which generates an inhibit pulse having a pulse width wider than a pulse width of a drive pulse;
   a continuous pulse generation circuit, which generates a continuous pulse having a pulse width narrower than the pulse width of the drive pulse;
   an AND gate, which determines a logical product of the inhibit pulse sent from the inhibit generation circuit and the continuous pulse sent from the continuous pulse generation circuit, to thereby obtain an intermittent pulse train;

a combined transformer, which receives an input of the drive pulse on one side of a primary winding of the combined transformer, and receives an input of the intermittent pulse train on another side of the primary winding of the combined transformer, to thereby generate a combined pulse in which the drive pulse and the intermittent pulse train are combined with each other in a secondary winding of the combined transformer;

a pulse separation circuit for separating only the drive pulse from the combined pulse appearing in the secondary winding of the combined transformer, to thereby generate a pulse for turning ON/OFF the semiconductor switch connected to the primary winding of the analog signal transformer; and a rectifying/smoothing circuit connected to the secondary winding of the combined transformer, which obtains a direct current voltage corresponding to the intermittent pulse train, to thereby apply the direct current voltage to the primary winding of the analog signal transformer through high resistance.

6. An analog multiplexer with an insulated power supply according to claim 5, wherein the pulse separation circuit removes the intermittent pulse train from the drive pulse generated by the combined transformer through polarity separation of a diode to supply the drive pulse between control input terminals of the semiconductor switch.

7. An analog multiplexer with an insulated power supply according to claim 5, wherein the rectifying/smoothing circuit removes the drive pulse through polarity separation to obtain the direct current voltage corresponding to the intermittent pulse train.

8. An analog multiplexer with an insulated power supply, comprising:

an analog signal transformer, which receives an input of an analog signal in a primary winding of the analog signal transformer via a first semiconductor switch, and performs ON/OFF driving on the first semiconductor switch, to thereby generate a pulse with an amplitude of the analog signal in a secondary winding of the analog signal transformer;

a drive transformer, which receives an input of a drive pulse in a primary winding of the drive transformer via a second semiconductor switch, to thereby generate a pulse for turning ON/OFF the first semiconductor switch in a secondary winding of the drive transformer;

an inhibit generation circuit, which generates an inhibit signal configured to generate a timing at which only a pulse width of the drive pulse for driving the first semiconductor switch is inhibited;

a continuous pulse generation circuit, which generates a continuous pulse having a pulse width narrower than the pulse width of the drive pulse;

an AND gate, which determines a logical product of the inhibit signal sent from the inhibit generation circuit and the continuous pulse sent from the continuous pulse generation circuit, to thereby obtain an intermittent pulse train for driving a primary winding of a power supply transformer so as to form a continuous pulse train during a period other than a timing corresponding to the pulse width of the drive pulse; and a rectifying/smoothing circuit connected to a secondary winding of the power supply transformer, which obtains a direct current voltage corresponding to the intermittent pulse train, to thereby apply the direct current voltage to the primary winding of the analog signal transformer via a constant current circuit.

9. An analog multiplexer with an insulated power supply, comprising:

an analog signal transformer, which receives an input of an analog signal in a primary winding of the analog signal transformer via a first semiconductor switch, and performs ON/OFF driving on the first semiconductor switch, to thereby generate a pulse with an amplitude of the analog signal in a secondary winding of the analog signal transformer;

a drive transformer, which receives an input of a drive pulse in a primary winding of the drive transformer via a second semiconductor switch, to thereby generate a pulse for turning ON/OFF the first semiconductor switch in a secondary winding of the drive transformer;

an inhibit generation circuit, which generates an inhibit signal configured to generate a timing at which only a period narrower than a pulse width of the drive pulse for driving the first semiconductor switch is inhibited;

a continuous pulse generation circuit, which generates a continuous pulse having a pulse width narrower than the pulse width of the drive pulse;

an AND gate, which determines a logical product of the inhibit signal sent from the inhibit generation circuit and the continuous pulse sent from the continuous pulse generation circuit, to thereby obtain an intermittent pulse train for driving a primary winding of a power supply transformer so as to form a continuous pulse train during a period other than the period narrower than the pulse width of the drive pulse; and a rectifying/smoothing circuit connected to a secondary winding of the power supply transformer, which obtains a direct current voltage corresponding to the intermittent pulse train, to thereby apply the direct current voltage to the primary winding of the analog signal transformer via a constant current circuit.

* * * * *